US006184125B1

(12) United States Patent
Chigusa et al.

(10) Patent No.: US 6,184,125 B1
(45) Date of Patent: Feb. 6, 2001

(54) METHOD OF FABRICATING CONDUCTIVE ANTI-REFLECTION FILM FOR A CATHODE RAY TUBE

(75) Inventors: Hisashi Chigusa, Urawa; Michiyo Abe, Tomioka; Katsuyuki Aoki, Fukaya, all of (JP)

(73) Assignee: Kabushiki Kaisha Toshiba, Kawasaki (JP)

(*) Notice: Under 35 U.S.C. 154(b), the term of this patent shall be extended for 0 days.

(21) Appl. No.: 09/372,046

(22) Filed: Aug. 11, 1999

Related U.S. Application Data

(62) Division of application No. 08/898,863, filed on Jul. 23, 1997, now Pat. No. 5,965,975.

(30) Foreign Application Priority Data

Jul. 24, 1996 (JP) .................................................... 8-194526

(51) Int. Cl.$^7$ ................................................ H01L 21/4763

(52) U.S. Cl. ............................................ 438/636; 313/478

(58) Field of Search .................................. 427/64, 58, 78; 313/478, 479, 480, 110, 112; 428/446, 428, 448, 701, 702; 438/636

(56) References Cited

U.S. PATENT DOCUMENTS

| | | | | |
|---|---|---|---|---|
| 4,785,217 | | 11/1988 | Matsuda et al. . | |
| 4,873,120 | * | 10/1989 | Itou et al. | 427/64 |
| 5,122,709 | | 6/1992 | Kawamura et al. . | |
| 5,147,460 | * | 9/1992 | Otaki | 106/626 |
| 5,218,268 | * | 6/1993 | Matsuda et al. | 313/478 |
| 5,330,791 | * | 7/1994 | Aihara et al. | 427/215 |
| 5,444,329 | | 8/1995 | Matsuda et al. . | |
| 5,552,178 | * | 9/1996 | Seo et al. | 427/64 |
| 5,627,429 | * | 5/1997 | Iwasaki | 313/474 |
| 5,652,476 | | 7/1997 | Matsuda et al. . | |
| 5,808,400 | * | 9/1998 | Liu | 313/306 |
| 5,841,227 | * | 11/1998 | Terpin | 313/479 |
| 5,863,596 | * | 1/1999 | Kojima et al. | 427/64 |
| 5,993,279 | * | 11/1999 | Fukuyo et al. | 445/26 |

FOREIGN PATENT DOCUMENTS

| | | |
|---|---|---|
| 41 35 448 | 5/1992 | (DE) . |
| 0 533 030 | 3/1993 | (EP) . |
| 0 708 063 | 4/1996 | (EP) . |
| 2 629 268 | 9/1989 | (FR) . |
| 2 662 022 | 11/1991 | (FR) . |
| 61-118932 | 6/1986 | (JP) . |
| 61-118946 | 6/1986 | (JP) . |
| 63-160140 | 7/1988 | (JP) . |
| 1-242769 | 9/1989 | (JP) . |
| 6-208003 | 7/1994 | (JP) . |
| 6-310058 | 11/1994 | (JP) . |
| 8-77832 | 3/1996 | (JP) . |
| 8-102227 | 4/1996 | (JP) . |

OTHER PUBLICATIONS

Ono et al., "A New Antireflective and Antistalic Double–Layered Coating for CRTs," SID 92 Digest (1992), pp. 511–513.

* cited by examiner

*Primary Examiner*—Matthew Smith
*Assistant Examiner*—Robert A. Hullinger
(74) *Attorney, Agent, or Firm*—Finnegan, Henderson, Farabow, Garrett & Dunner, L.L.P.

(57) ABSTRACT

A second coat film is formed on a first coat film containing a conductive substance, the second coat film having an expansion coefficient almost the same as the expansion coefficient of the first coat film under a sintering condition. The first and second coat films are sintered at the same time. Thus, a conductive anti-reflection film with sufficiently low surface resistance, excellent water resistance and chemical resistance, and reduced reflected light can be obtained. When the conductive anti-reflection film is used, a cathode ray tube that is almost free from the AEF (Alternating Electric Field) and that displays a high quality picture for a long time can be obtained.

5 Claims, 3 Drawing Sheets

METHOD OF FABRICATING CONDUCTIVE ANTI-REFLECTION FILM FOR A CATHODE RAY TUBE

This is a division of application Ser. No. 08/898,863, filed Jul. 23, 1997 now U.S. Pat. No. 5,965,975. The contents of this application being relied upon and incorporated by reference herein.

BACKGROUND OF THE INVENTION

1. Field of the Invention

The present invention relates to a conductive anti-reflection film that functions as an anti-reflection film and protects an AEF (Alternating Electric Field) from taking place, a fabrication method thereof, and a cathode ray tube having the conductive anti-reflection film formed on an outer surface of a face panel of a face plate.

2. Description of the Related Art

In recent years, it is pointed out that an electromagnetic wave generated in the vicinity of an electron gun and a deflection yoke of a Cathode ray tube used in TV sets and computers leaks out and may adversely affect an electronic unit disposed therearound.

To prevent the cathode ray tube from leaking out the electromagnetic wave (electric field), it is necessary to decrease the surface resistance of the face panel thereof. In other words, Japanese Patent Laid-Open Application Nos. 61-118932, 61-118946, and 63-160140 disclose various surface treatment methods for preventing a face panel from being statically charged. With such methods, the alternating electric field (AEF) can be prevented from leaking out.

To prevent the face panel from being statically charged, the sufficient surface resistance of the conductive film is around $1\times10^{11}$ ohms/□ or less. However, with such a surface resistance, the AEF cannot be prevented from taking place. To prevent the AEF from taking place, the surface resistance of the conductive film should be $5\times10^{2}$ ohms/□ or less.

Examples of the method for forming a conductive film with a low surface resistance are gas phase methods such as PVD method, CVD method, and sputtering method. For example, Japanese Patent Laid-Open Application No. 1-242769 discloses a method for forming a low resistance conductive film corresponding to the sputtering method. Since the gas phase method requires a large scaled machine for forming a conductive film, the investment cost for the machine is high. In addition, this method is not suitable for quantitative fabrication.

Moreover, the lower the specific resistance of a conductive material composing a conductive film, the higher conductivity can be obtained. Thus, when a conductive film containing metal particles is used, the AEF can be effectively prevented from taking place.

However, generally, even if a film containing metal particles is thin, it absorbs visible light. Thus, when the film is thick, the transmissivity of light in a short wave length region (blue region) decreases. Consequently, the luminance of the cathode ray tube decreases. When a conductive film is composed of only metal particles without a binder, since the bond force of the metal particles is insufficient, the film hardness becomes low. In contrast, when a conductive film is composed of metal particles with a binder, the resistance of the conductor film becomes high. Thus, sufficient conductivity cannot be obtained.

As another related art reference, Japanese Patent Laid-Open Application No. 6-208003 discloses a two-layered conductive anti-reflection film having a first layer that is a high refractive conductive layer containing conductive particles with a refractive index of 2 or more and a second layer that is a low refractive silica layer with a refractive index of 2 or less, the second layer being disposed on the first layer. In the two-layered conductive anti-reflection film, a light absorbing substance such as a coloring matter is contained so as to cause the color of the reflected light to be neutral and thereby suppress the reflected light from being colored. However, since the refractive index and reflectivity of the conductive layer containing metal particles are high, only with the light absorbing characteristics of the light absorbing substance, it is difficult to suppress the reflected light from being colored.

A method for forming a transparent conductive film is known as coating method or wet method. In this method, a solution in which transparent and conductive particles are dispersed is coated on a substrate and thereby a coat film is formed. The coat film is dried and hardened or sintered. For example, a solution of which particles of tin oxide containing Sb (ATO) or particles of tin oxide containing In (ITO) and a binder of silica ($SiO_2$) are mixed and dispersed is coated on a substrate and thereby a coat film is formed. The coat film is dried and hardened or sintered and thereby a transparent conductive film is obtained. In such a transparent conductive film, conductive particles (of ATO or ITO) mutually contact and thereby conductivity is obtained. It is known that the conductive particles mutually contact by the following mechanism.

Just after the coat film has been formed on the substrate, the conductive particles do not mutually contact. Silica as a binder is present in a gel state between each conductive particle. By sintering the coat film at a temperature of 200° C., the silica in the gel state is closely and densely formed. In this process, individual conductive particles mutually contact each other. Thus, the conductivity of the conductive particles is obtained.

Although the transparent conductive film formed in such a manner is conductive, since much insulation binder component of densely formed silica is present between each conductive particle, sufficient conductivity that prevents the AEF from taking place cannot be obtained.

To solve such a problem, Japanese Patent Laid-Open Application No. 8-102227 discloses a method for forming a transparent conductive film that prevents the AEF from taking place. The transparent conductive film is formed in the following manner. A solution in which conductive particles that do not contain polymer binder component are dispersed coated on a substrate. Thus, a first coat film containing the conductive particles is formed. Thereafter, a second coat film containing a silica binder or the like is formed on the first coat film. Thereafter, the first and second coat films are sintered at the same time. Thus, a transparent conductive film that has conductivity necessary for preventing the AEF from taking place is formed. In this method, when the silica gel contained in the second coat film is sintered and thereby densely formed, the first coat film is also densely formed. Thus, the conductive particles mutually contact each other and thereby sufficient conductivity can be obtained. When the solution containing the silica binder or the like is coated on the substrate, the binder slightly penetrates into the first coat film. However, since the amount of silica that penetrates into the conductive particles is small in comparison with the case that a mixture of conductive particles and silica binder is coated on the substrate, it is expected that the conductivity is improved.

However, in such a method, when the first and second coat films are sintered, since the second coat film is more contracted than the first coat film, the conductive particles contained in the first coat film are unequally densified. Consequently, since a portion of which conductive particles do not mutually contact each other takes place, as the conductive film, sufficient conductivity cannot be obtained.

SUMMARY OF THE INVENTION

The present invention is made from the above-described point of view. An object of the present invention is to provide a conductive anti-reflection film that almost prevents the AEF (Alternating Electric Field) from taking place, that suppresses reflected light from being colored, and that has excellent water resistance and chemical resistance.

Another object of the present invention is to provide a fabrication method of a conductive anti-reflection film that almost prevents the AEF from taking place, that suppresses reflected light from being colored, and that has excellent water resistance and chemical resistance.

A further object of the present invention is to provide a cathode ray tube that almost prevents the AEF from taking place and displays a high quality picture for a long time.

A first aspect of the present invention is a conductive anti-reflection film, comprising a first layer containing conductive particles, and a second layer formed on said first layer, said second layer containing (1) $SiO_2$ and (2) a compound composed of at least one structural unit expressed by the following general formula $R_nSiO_{(4-n)/2}$ where R represents an organic group that is substitutable or not substitutable, and n represents an integer ranging from 0 to 3.

A second aspect of the present invention is a conductive anti-reflection film, comprising a first layer containing conductive particles, and a second layer formed on said first layer, said second layer containing (1) $SiO_2$, (2) $ZrO_2$, and (3) a compound composed of at least one structural unit expressed by the following general formula $R_nSiO_{(4-n)/2}$ where R represents an organic group that is substitutable or not substitutable, and n represents an integer ranging from 0 to 3.

A third aspect of the present invention is a conductive anti-reflection film, comprising a first layer containing conductive particles, and a second layer formed on said first layer, said second layer containing (1) $SiO_2$, and (2) $ZrO_2$.

A forth aspect of the present invention is a fabrication method of a conductive anti-reflection film, comprising the steps of forming a first coat film on a substrate, the first coat film containing a conductive substance and having a first expansion coefficient under a first condition, forming a second coat film on the first coat film, the second coat film having a second expansion coefficient substantially equal to the first expansion coefficient under the first condition, and sintering the first and second coat films.

A fifth aspect of the present invention is a fabrication method of a conductive anti-reflection film, comprising the steps of forming a first coat film on a substrate, the first coat film containing a conductive substance, forming a second coat film on the first coat film, the second coat film containing at least one compound expressed by the following general formula $R_nSi(OH)_{4-n}$ where R represents an organic group that is substitutable or not substitutable, and n represents an integer ranging from 0 to 3, and sintering the first and second coat films.

A sixth aspect of the present invention is-a fabrication method of a conductive anti-reflection film, comprising the steps of forming a first coat film on a substrate, the first coat film containing a conductive substance, forming a second coat film on the first coat film, the second coat film containing (1) at least one compound expressed by the following general formula $R_nSi(OH)_{4-n}$ where R represents an organic group that is substitutable or not substitutable, and n represents an integer ranging from 0 to 3, and (2) at least one compound selected from the group consisting of mineral acid salt of Zr, organic acid salt of Zr, alkoxide of Zr, complex of Zr, and hydrolyzed substance thereof, and sintering the first and second coat films.

A seventh aspect of the present invention is a fabrication method of a conductive anti-reflection film, comprising the steps of forming a first coat film containing a conductive substance on a substrate, forming a second coat film on the first coat film, the second coat film containing (1) at least one compound selected from the group consisting of mineral acid salt of Si, organic acid salt of Si, alkoxide of Si, complex of Si, and hydrolyzed substance thereof, and (2) at least one compound selected from the group consisting of mineral acid salt of Zr, organic acid salt of Zr, alkoxide of Zr, complex of Zr, and hydrolyzed substance thereof, and sintering the first and second coat films.

An eighth aspect of the present invention is a cathode ray tube, comprising a face plate having a first surface with a fluorescent substance, a first layer formed on a second surface of said face plate, the second surface being opposite to a first surface of said face plate, said first layer containing conductive particles, and a second layer formed on said first layer, said second layer containing (1) $SiO_2$, and (2) a compound composed of at least one structural unit expressed by the following general formula $R_nSiO_{(4-n)/2}$ where R represents an organic group that is substitutable or not substitutable, and n represents an integer ranging from 0 to 3.

A ninth aspect of the present invention is a cathode ray tube, comprising a face plate having a first surface with a fluorescent substance, a first layer formed on a second surface of said face plate, the second surface being opposite to a first surface of said face plate, said first layer containing conductive particles, and a second layer formed on said first layer, said second layer containing (1) $SiO_2$, (2) $ZrO_2$, and (3) a compound composed of at least one structural unit expressed by the following general formula $R_nSiO_{(4-n)/2}$ where R represents an organic group that is substitutable or not substitutable, and n represents an integer ranging from 0 to 3.

A tenth aspect of the present invention is a cathode ray tube, comprising a face plate having a first surface with a fluorescent substance, a first layer formed on a second surface of said face plate, the second surface being opposite to a first surface of said face plate, said first layer containing conductive particles, and a second layer formed on said first layer, said second layer containing (1) $SiO_2$, and (2) $ZrO_2$.

Examples of conductive particles contained in the first layer are ultra fine particles of at least one substance selected from the group consisting of silver, silver compound, copper, and copper compound. Examples of the silver compound are silver oxide, silver nitrate, silver acetate, silver benzoate, silver bromate, silver carbonate, silver chloride, silver chromate, silver citrate, and cyclohexane butyric acid. To allow the silver compound to be stably present in the first layer, it is preferably an alloy of silver such as Ag—Pd, Ag—Pt, or Ag—Au. Examples of the copper compound are copper sulfate, copper nitrate, and copper phthalocyanine. At least one type of particles composed of these compounds and silver can be selected and used. The size of particles of silver, silver compound, copper, and copper compound is preferably 200 nm or less as a diameter of particles with the equivalent volume. When the diameter of the conductive particles exceeds 200 nm, the transmissivity of light of the conductive anti-reflection film remarkably decreases. In addition, since the particles cause light to scatter, the conductive anti-reflection film becomes dim, thereby decreasing the resolution of the cathode ray tube or the like.

Since the first layer that contains particles of at least one substance selected from the group consisting of silver, silver compound, copper, and copper compound absorbs light in the visible light range, the transmissivity of light decreases. However, the first layer has a low surface resistance equivalent to specific resistance, the thickness of the first layer can be decreased. Thus, the decrease of the transmissivity of light can be suppressed within 30%. In addition, a low resistance that sufficiently prevents the AEF from taking place can be accomplished.

FIG. 1 is a graph showing the relation between transmissivity of light and surface resistance of a conductive anti-reflection film composed of a first layer containing silver particles and a second layer containing $SiO_2$, the second layer being disposed on the first layer. As described above, to prevent the AEF from taking place, the surface resistance should be $5\times10^2$ ohms/□ or less. As is clear from FIG. 1, when the transmissivity of light of the conductive anti-reflection film is around 80%, the surface resistance thereof is as low as $5\times10^2$ ohms/□. Thus, the conductive anti-reflection film can prevent the AEF from taking place while maintaining high transmissivity of light.

According to the present invention, the second layer containing (1) $SiO_2$ and (2) a compound composed of at least one structural unit expressed by the following general formula $R_nSiO_{(4-n)/2}$ where R represents an organic group that is substitutable or not substitutable; and n represents an integer ranging from 0 to 3, or (1) $SiO_2$, (2) $ZrO_2$, and (3) a high molecular compound composed of at least one structural element expressed by the following general formula $R_nSiO_{(4-n)/2}$ where R represents an organic group that is substitutable or not substitutable; and n represents an integer ranging from 0 to 3, or (1) $SiO_2$ and (2) $ZrO_2$. is formed on the first layer. According to the present invention, to effectively decrease the reflectivity of the conductive anti-reflection film, a third layer containing for example $SiO_2$ can be disposed on the second layer. In other words, the conductive anti-reflection film can be composed of more than two layers. At this point, when the difference of refractive indexes of two adjacent layers is small, the reflectivity of the conductive anti-reflection film can be effectively decreased. According to the present invention, when the conductive anti-reflection film is composed of first and second layers, the thickness of the first layer is 200 nm or less and the refractive index thereof is in the range from 1.7 to 3. The thickness of the second layer is less than 10 times the thickness of the first layer and the refractive index thereof is in the range from 1.38 to 1.70. When the third layer is disposed on the second layer, the thickness and refractive index of each of the first to third layers are properly selected corresponding to the transmissivity of light, refractive index, and so forth of the entire anti-reflection film.

When the conductive anti-reflection film is composed of the first and second layers, the conductive anti-reflection film is fabricated by forming a first coat film on a substrate, the first coat film containing a conductive substance, forming a second coat film on the first coat film, the second coat film containing at least one compound expressed by the following general formula $R_nSi(OH)_{4-n}$ where R represents an organic group that is substitutable or not substitutable; and n represents an integer ranging from 0 to 3, and sintering the first and second coat films. The compound expressed by the general chemical formula $R_nSi(OH)_{4-n}$ (where R is an organic group that is substitutable or not substitutable; and n is an integer ranging from 0 to 3) can be easily obtained by mixing a solvent such as water with alkoxy silane. Examples of alkoxy silane are dimethyl dimethoxy silane and 3-glycidoxyproyltrimethoxysilane.

When the second coat film is sintered, at least one compound expressed by the general chemical formula $R_nSi(OH)_{4-n}$ (where R is an organic group that is substitutable or not substitutable; and n is an integer ranging from 0 to 3) produces a siloxane bond. Thus, the second layer containing a silicone and $SiO_2$ is formed. At this point, since the second coat film is contracted corresponding to the first coat film, the conductive material of the first coat film is equally densified. Thus, the resultant conductive anti-reflection film has high conductivity. In this case, the amount of alkoxy silane added to the second coat film is preferably 5 to 30% by weight as solid content equivalent to $SiO_2$. If the amount of alkoxy silane added to the second coat film is smaller than 5% by weight as solid content equivalent to $SiO_2$, when the second coat film is sintered, it is more contracted than the first coat film. Thus, the resultant conductive anti-reflection film cannot have sufficient conductivity. In contrast, if the amount of slkoxy silane added to the second coat film exceeds 30% by weight as solid content equivalent to $SiO_2$, the hardness of the conductive anti-reflection film decreases. The first expansion coefficient of the first coat film and the second expansion coefficient of the second coat film are not limited as long as the first coat film and the second coat film are equally or almost equally contracted under the conditions of the temperature, pressure, and so forth when the first coat film and the second coat film are sintered. The expansion coefficient ($\alpha$) is defined as follows.

$\alpha=(dV/d\theta)/V$ (where V represents a volume; $\theta$ represents a temperature).

When the third coat film is disposed on the second coat film and thereby the conductive anti-reflection film is composed of more than two films, the first to third expansion coefficients of the first to third coat films are not limited as long as the first to third coat films are equally or almost equally contracted under the conditions of the temperature, pressure, and so forth when the first to third coat films are sintered.

In addition, according to the present invention, when a derivative of alkoxy silane that has a fluoroalkyl group as alkoxy silane that is a component for controlling the contraction of the coat film disposed on the substrate that is sintered is used, the water resistance and chemical resistance of the formed layer are remarkably improved. Examples of the derivative of alkoxy silane that has the fluoroalkyl group are heptadecafluorodecylmethyldimethoxysilane, heptadecafluorodecyltrichlorosilane, heptadecafluorodecyltrimethoxysilane, trifluoropropyltrimethoxysilane, tridecafluorooctyltrimethoxysilane, and methoxy silane expressed by the following chemical formula.

$$(MeO)_3SiC_2H_4C_6F_{12}C_2H_4Si(MeO)_3$$

With a derivative of alkoxy silane having fluoroalkyl group, the formed layer has water resistance and chemical resistance by the following mechanism. When a substance that controls the sintering contraction is contained in the second layer and the sintering contraction of the second layer is the same as the sintering contraction of the first layer, the density of the sintered second layer (silica layer) decreases. In other words, the second layer has many pores and the texture of the second layer becomes porous. Thus, water and chemical such as acid and alkali easily penetrate the inside of the second layer. Acid or alkali that penetrates into the second layer reacts with metal particles composing the first layer. Thus, the reliability of the entire conductive anti-reflection film deteriorates. However, when a derivative of alkoxy silane having fluoroalkyl group is added to the second coat film, the fluoroalkyl group is present on the front surface of pores of the sintered second layer. Thus, the critical surface tension of the pores of the second layer decreases, thereby preventing water and chemicals such as acid and alkali from penetrating into the second layer.

As with alkoxy silane added to the second coat film, the amount of a derivative of alkoxy silane having fluoroalkyl group added to the second coat film is preferably in the range from 5 to 30% by weight as solid content equivalent to $SiO_2$. If the content of alkoxy silane of fluorine type added to the second coat film is less than 5% by weight as solid content equivalent to $SiO_2$, the effect of the fluoroalkyl group hardly takes place in the second layer that has been sintered. If the content of alkoxy silane of fluorine type added to the second coat film exceeds 30% by weight as solid content equivalent to $SiO_2$, the scratch hardness of the second layer that has been sintered deteriorates.

In addition, according to the present invention, the second film is formed just above the first coat film containing a conductive agent. The second coat film contains the above-described substance that produces $SiO_2$ and a Zr compound that produces $ZrO_2$ in the sintering process. The conductive agent is a substance that produces conductive particles in the first layer when it is sintered. The Zr compound that produces $ZrO_2$ in the second coat film being sintered is composed of at least one type of compounds selected from mineral acid salt of Zr, organic acid salt thereof, alkoxide thereof, complex thereof, and partial hydrolyzed substance thereof. In particular, alkoxide such as zirconium tetraisobutoxide is preferably used. When the first coat film and the second coat film are sintered at the same time, a second layer containing $SiO_2$ and $ZrO_2$ is formed. The conductive anti-reflection film having a laminate structure of the first layer and the second layer has excellent conductivity and anti-reflection characteristics. In addition, since the second layer contains $ZrO_2$, the reflected color becomes neutral and thereby suppressing the reflected light from being colored (particularly, in blue).

The content of $ZrO_2$ of the second layer is 5 to 40 mole % to the content of $SiO_2$. More preferably, the content of $ZrO_2$ of the second layer is 10 to 20 mole % to the content of $SiO_2$. If the content of $ZrO_2$ of the second layer is less than 5 mole % to the content of $SiO_2$, the effect of $ZrO_2$ hardly takes place. In contrast, if the content of $ZrO_2$ of the second layer exceeds 40 mole % to the content of $SiO_2$, the hardness of the second layer decreases. In addition, according to the present invention, $ZrO_2$ can be contained in the second layer along with a silicone produced with alkoxy silane. When the second layer containing a silicone of fluorine type produced with alkoxy silane having fluoroalkyl group and $ZrO_2$ is disposed just above the first layer, the resultant conductive anti-reflection film has sufficiently low surface resistance that effectively prevents the AEF from taking place. In addition, the conductive anti-reflection film has improved water resistance, acid resistance, and alkali resistance.

According to the present invention, when the first coat film is formed, a solution in which particles of Ag, Cu, or the like are dispersed along with for example nonionic surface active agent is coated on the substrate disposed on the outer surface of the face panel of the cathode ray tube by the spin coat method, spray method, or dipping method. In this case, to suppress the first coat film from being unevenly formed and to allow the film thickness to be equal, the surface temperature is preferably in the range from 5 to 60° C. The first coat film is formed so that the thickness thereof becomes 25 nm to 100 nm. The thickness of the first coat film can be easily controlled by adjusting the concentration of particles of a metal such as Ag or Cu contained in the solution, the rotation of a spin coater used in the spin coat method, the amount of dispersed solution in the spray method, or the pulling speed in the dipping method. As a solvent of the solution, when necessary, ethanol, IPA, or the like can be contained along with water. In addition, organic metal compound, pigment, dye, and so forth can be contained in the solution so as to add another function to the first layer.

When the second coat film is formed on the first coat film, a solution containing alkoxy silane can be coated on the first coat film by the spin coat method, spray method, dipping method, or the like. The thickness of the second coat film is normally in the range from 100 nm to 2000 nm. The thickness of the second coat film can be easily controlled by adjusting the concentration of the solution containing alkoxy silane, the rotation of a spin coater in the spin coat method, the amount of solution in the spray method, or the pulling speed in the dipping method. By sintering the first and second coat films at a temperature of 150 to 450° C. for 10 to 180 minutes, a conductive anti-reflection film according to the present invention can be obtained.

These and other objects, features and advantages of the present invention will become more apparent in light of the following detailed description of best mode embodiments thereof, as illustrated in the accompanying drawings.

DESCRIPTION OF PREFERRED EMBODIMENTS

Next, with reference to practical embodiments, the present invention will be described in detail. However, it should be noted that the present invention is not limited to the embodiments that follow.

First and Second Embodiments 0.5 g of particles of a silver compound such as $Ag_2O$, $AgNO_3$, or AgCl was solved with 100 g of water. Thus, a first solution was prepared. 5% by weight of 3-glycidoxypropyltrimethoxysilane was added to a silicate solution composed of 8 parts by weight of methyl silicate, 0.03 parts by weight of nitric acid (conq), 500 parts by weight of ethanol, and 15 parts by weight of water. Thus, a second solution was prepared. Likewise, 30% by weight of 3-glycidexypropyltrimethoxysilane was added to a silicate solution composed of 8 parts by weight of methyl silicate, 0.03 parts by weight of nitric acid (conq), 500 parts by weight of ethanol, and 15 parts by weight of water. Thus, a third solution was prepared.

Thereafter, the outer surface of a face panel (17-inch panel) of a cathode ray tube that has been assembled was buffed with cerium oxide so as to remove dust and oil. Next, the first solution was coated as a first coat film on the outer surface of the face panel of the cathode ray tube by the spin coat method. The first solution was coated in the conditions that the panel (coated surface) temperature was 45° C., that the spin coater was rotated at 80 rpm for 5 sec when the solution was poured, and that the spin coater was rotated at 150 rpm for 80 sec when the solution had been coated (the coat film had been formed). Thereafter, the second or third solution was coated on the first coat film by the spin coat method in the conditions that the spin coater was rotated at 150 rpm for 5 sec when the solution was poured and that the spin coater was rotated at 150 rpm for 80 sec when the solution had been coated. Next, the first and second coat films were sintered at a temperature of 210° C. for 30 minutes.

Figure 1:
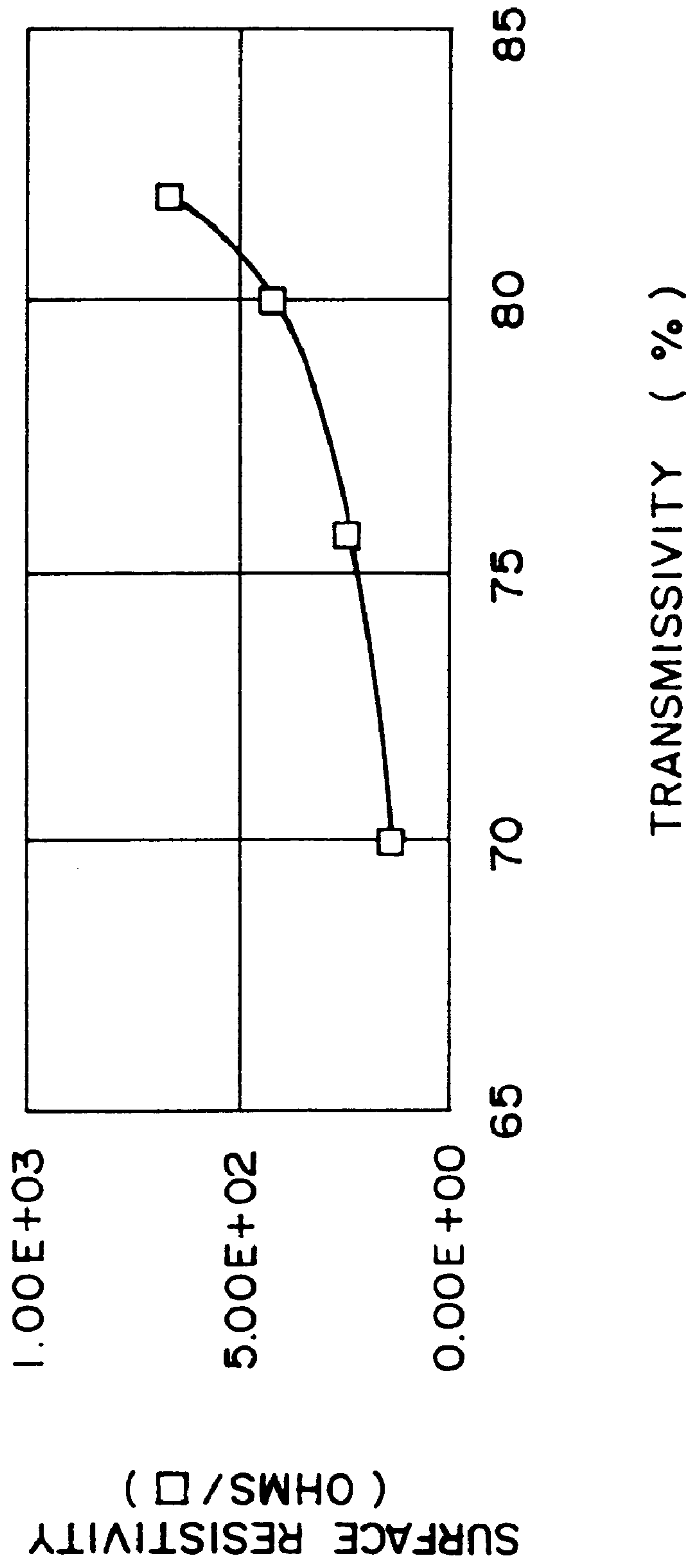
FIG. 1 is a graph showing the relation of transmissivity of light and surface resistance of a conductive anti-reflection film composed of a first layer containing silver particles and a second layer containing $SiO_2$, the second layer being disposed just above the first layer.
Figure 2:
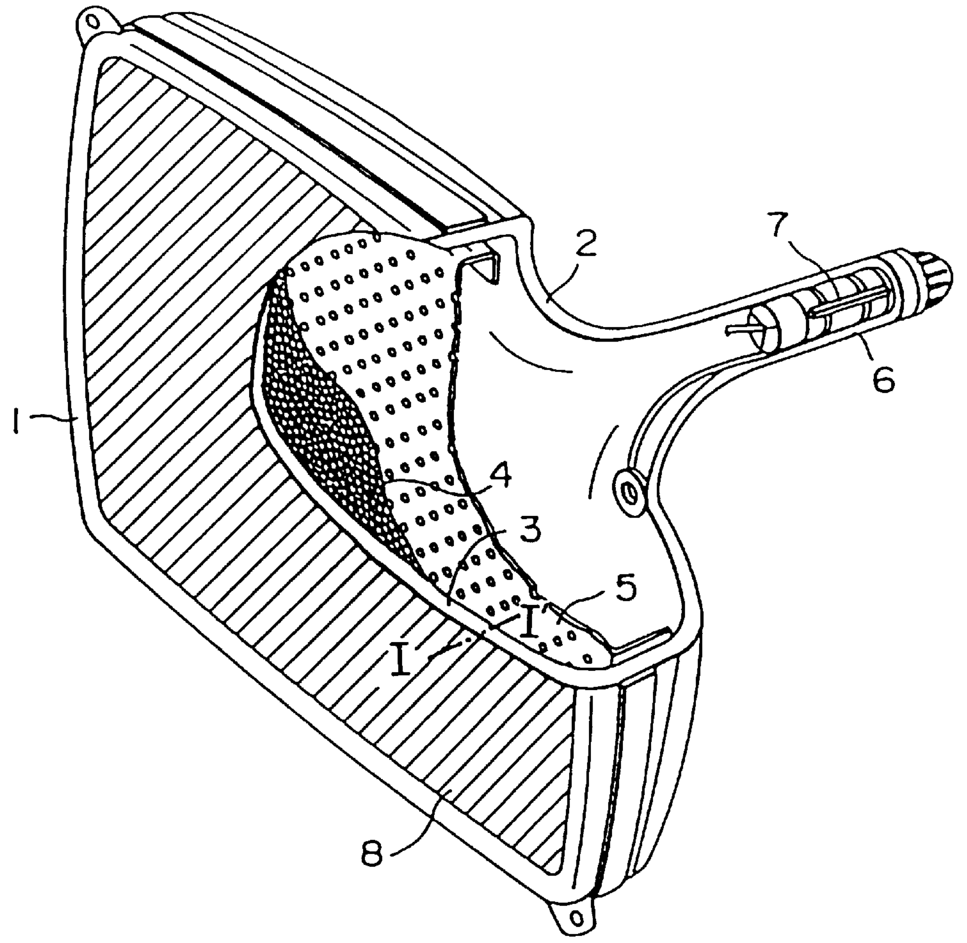
FIG. 2 is a schematic diagram showing the structure of a cathode ray tube according to an embodiment of the present invention.

FIG. 2 shows a color cathode ray tube of which the first and second coat films have been formed in.

In FIG. 2, the color cathode ray tube has a housing composed of a panel 1 and a funnel 2 integrated therewith. A fluorescence surface 4 is formed on the inner surface of a face panel 3 disposed on the panel 1. The fluorescence surface 4 is composed of three color fluorescence layers that emit light of blue, green, and red colors and a black light absorbing layer. The three color fluorescence layers are formed in a conventional manner by coating slurry of which individual fluorescent substances are dispersed along with PVA, surface active agent, pure water, and so forth. The three color fluorescence layers may be formed in a stripe shape or a dot shape. In this example, the three fluorescence layers were formed in a dot shape. A shadow mask 5 that has many electron beam holes was disposed opposite to the fluorescence surface 4. An electron gun 7 that radiates an electron beam to the fluorescence surface 4 was disposed inside a neck portion of the funnel 2. An electron beam of the electron gun 7 strikes the fluorescence surface 4, causing the three color fluorescence layers to excite and emit light of three colors. A conductive anti-reflection film 8 is formed on the outer surface of the face panel 3.

Figure 3:
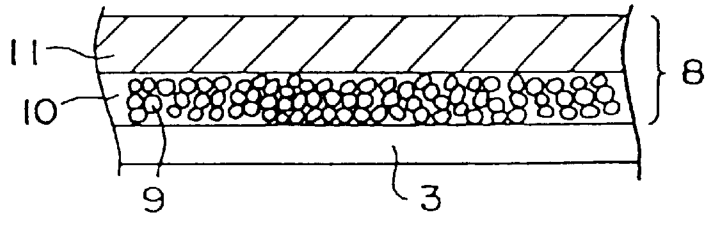
FIG. 3 is a sectional view taken along line A–A' of the cathode ray tube shown in FIG. 2.

FIG. 3 is a sectional view taken along line I–I '" of the cathode ray tube shown in FIG. 2.

As shown in FIG. 3, a conductive anti-reflection film 8 is formed on the front surface of the face panel 3. The conductive anti-reflection film 8 is composed of a first layer 10 in which conductive particles 9 such as silver particles are equally dispersed and a second layer 11 containing $SiO_2$ and silicone.

As compared examples, each of fourth to sixth solutions that contain 3-glycidoxypropyltrimethoxysilane as solid content equivalent to $SiO_2$ as shown in Table 1 (in a first compared example, only silicate solution was used as an upper layer coat solution) was coated on the first coat film by the spin coat method as with the first and second embodiments. Thus, second coat films corresponding to the fourth to sixth solutions were formed. Thereafter, the first and second layers were sintered at the same time in the same manner as the first and second embodiments corresponding to the fourth to sixth solutions.

Next, the panel resistance, surface resistance, and film hardness of the first and second embodiments and the first to third compared examples were measured. The panel resistance was measured by soldering a V edge of the 17-inch panel and measuring the resistance between the soldered portions. The surface resistance was measured with Loresta IP MCP-T250 made by YUKA-DENSI CO., LTD. The film hardness was measured as a nail hardness in such a manner that a film that was not scratched by a nail is denoted by O and a film that was scratched by a nail is denoted by X. These measured results are shown in Table 1.

TABLE 1

| | First Embodi-ment | Second Embodi-ment | First Compared Example | Second Compared Example | Third Compared Example |
|---|---|---|---|---|---|
| Amount of alkoxy silane as solid content equivalent to $SiO_2$ (wt %) | 5 | 30 | 0 | 2 | 40 |
| Panel resistance (× $10^3$ ohms) | 4 | 3 | 30 | 15 | 3 |
| Surface resistance (× $10^2$ ohms/□) | 2.7 | 2.0 | 20 | 10 | 2.0 |
| Film hardness | o | o | o | o | x |

As is clear from Table 1, the conductive anti-reflection films according to the first and second embodiments have low surface resistance that effectively prevents the AEF from taking place. In addition, these conductive anti-reflection films have sufficient film hardness. On the other hand, since the amount of alkoxy silane added to the second coat film of the conductive anti-reflection films according to the first and second compared examples is less than 5% by weight as solid content equivalent to $SiO_2$. Thus, the panel resistance and the surface resistance of the conductive anti-reflection films according to the first and second compared examples are by one digit higher than those of the conductive anti-reflection films according to the first and second embodiments. Thus, the conductive anti-reflection films according to the first and second compared examples do not have conductivity that prevents the AEF from taking place. In addition, the amount of alkoxy silane added to the second coat film of the conductive anti-reflection film according to the third compared example exceeds 30% by weight as solid content equivalent to $SiO_2$, this conductive anti-reflection film has low surface resistance that prevents the AEF from taking place. However, since the film hardness of this conductive anti-reflection film is so low as it cannot be practically used.

Third and Fourth Embodiments

5% by weight of heptadecafluorodecyltrimethoxysilane as solid content equivalent to $SiO_2$ as shown in Table 2 was added to a silicate solution composed of 8 parts by weight of methyl silicate, 0.03 parts by weight of nitric acid (conq), 500 parts by weight of ethanol, and 15 parts by weight of water. Thus, a first solution was prepared. Likewise, 30% by weight of heptadecafluorodecyltrimethoxysilane as solid content equivalent to $SiO_2$ as shown in Table 2 was added to a silicate solution composed of 8 parts by weight of methyl silicate, 0.03 parts by weight of nitric acid (conq), 500 parts by weight of ethanol, and 15 parts by weight of water. Thus, a second solution was prepared.

Next, as with the first embodiment, each of the first and second solutions was coated on the first coat film formed on the outer surface of the face panel (17-inch panel) by the spin coat method in the same manner as the first embodiment. Thereafter, the first and second coat films were sintered at a temperature of 210° C. for 30 minutes.

As compared examples, each of third and fourth solutions of which heptadecafluorodecyltrimethoxysilane is added as solid content equivalent to $SiO_2$ as shown in Table 2 was coated on the first coat film by the spin coat method in the same manner as the first embodiment. Thus, second coat films corresponding to the third and fourth solutions were formed. Thereafter, corresponding to the third and fourth solutions, the first and second coat films were sintered at a temperature of 210° C. for 30 minutes.

Next, the panel resistance, surface resistance, and film hardness of the conductive anti-reflection films according to the third and fourth embodiments and the fourth and fifth compared examples were measured in the same manner as the first embodiment. In addition, a hot water dipping test and a chemical resistance test for these conductive anti-reflection films were performed. In the hot water dipping test, after the face panel was dipped in tap water at a temperature of 80° C. for 60 minutes, the resultant conductive anti-reflection films were observed. In Table 2, a conductive anti-reflection film whose appearance was not changed is denoted by O. A conductive anti-reflection film whose appearance was changed is denoted by X. In the chemical resisting test, for an acid resisting test, a water solution of 0.1% HCl was used. For an alkali resisting test, a solution of 3% ammonium was used. After the face panel was dipped in these solution for 24 hours, the resultant films were observed. In Table 2, a conductive anti-reflection film whose appearance was not changed is denoted by O. A conductive anti-reflection films that was discolored, swelled, and/or peeled is denoted by X. The measured results are shown in Table 2.

TABLE 2

| | Third Embodiment | Fourth Embodiment | Fourth Compared Example | Fifth Compared Example |
|---|---|---|---|---|
| Amount of fluoro alkoxy silane as solid content equivalent to $SiO_2$ (wt %) | 5 | 30 | 2 | 40 |
| Panel resistance ($\times 10^3$ ohms) | 5 | 3 | 10 | 2 |
| Surface resistance ($\times 10^2$ ohms/□) | 3.0 | 2.0 | 6.8 | 1.5 |
| Film hardness | o | o | o | x |
| Hot water dipping test | o | o | o | o |
| Acid resisting test | o | o | o | o |
| Alkali resisting test | o | o | x | o |

As is clear from Table 2, the conductive anti-reflection films according to the third and fourth embodiments have low surface resistance that effectively prevents the AEF from taking place. In addition, these conductive anti-reflection films have sufficient film hardness. When these conductive anti-reflection films are dipped in hot water, acid solution, and alkali solution, they are not discolored, swelled, and peeled off. Thus, these conductive anti-reflection films have excellent water resistance and chemical resistance. In contrast, the amount of alkoxy silane of fluorine type added to the second coat film of the conductive anti-reflection film according to the fourth compared example is less than 5% by weight as solid content equivalent to $SiO_2$. Thus, since the surface resistance of this conductive anti-reflection film is high, it does not have conductivity that prevents the AEF from taking place. In addition, the alkali resistance of the conductive anti-reflection film according to the fourth compared example is low. The amount of alkoxy silane of fluorine type added to the second coat film of the conductive anti-reflection film according to the fifth compared embodiment exceeds 30% by weight as solid content equivalent to $SiO_2$. Thus, the surface resistance of this conductive anti-reflection film is so low to prevent the AEF from taking place. In addition, the water resistance and chemical resistance of this conductive anti-reflection film are excellent. However, the film hardness of this conductive anti-reflection film is so low as it cannot be practically used.

Fifth to Eighth Embodiments

10% by weight of alcoxy silane having a fluoroalkyl group and expressed by $(MeO)_3SiC_2H_4C_6F_{12}C_2H_4Si(MeO)_3$ as solid content equivalent to $SiO_2$ was added to a silicate solution composed of 8 parts by weight of methyl silicate, 0.03 parts by weight of nitric acid (conq), 500 parts by weight of ethanol, and 15 parts by weight of water. In addition, 5 to 30 mol % of zirconium tetraisobutoxide (TBZR) to $SiO_2$ equivalent to $ZrO_2$ as shown in Table 3 was added to the resultant solution. Thus, first to fourth solutions are prepared.

Next, each of the first, second, third, and fourth solutions was coated on a first coat film formed on the outer surface of the face panel (17-inch panel) by the spin coat method in the same manner as the first embodiment. Thus, second coat films corresponding to the first, second, third, and fourth solutions were formed. Thereafter, corresponding to the first, second, third, and fourth solutions, the first and second coat films were sintered at a temperature of 210° C. for 30 minutes.

As compared examples, 10% by weight of alkoxy silane expressed by the above-described chemical formula as solid content equivalent to $SiO_2$ was added. In addition, the TBZR was added as shown in Table 3 (to $SiO_2$ equivalent to $ZrO_2$). Thus, fifth and sixth solutions were prepared. In the same manner as the fifth to eighth embodiments, each of the fifth and sixth solution was coated on a first coat film by the spin coat method. Thus, second coat films corresponding to the fifth and sixth solutions were formed. Thereafter, corresponding to the fifth and sixth solutions, the first and second coat films were sintered at the same time.

Next, the panel resistance, surface resistance, and film hardness of the conductive anti-reflection films according to the fifth to eighth embodiments and the sixth and seventh compared examples were measured in the same manner as the first embodiment. In addition, the hot water dipping test and chemical resistance test were performed in the same manner as the third and fourth embodiments. The measured results are shown in Table 3.

TABLE 3

| | Fifth Em-bodi-ment | Sixth Em-bodi-ment | Seventh Em-bodi-ment | Eighth Em-bodi-ment | Sixth Compared Example | Seventh Compared Example |
|---|---|---|---|---|---|---|
| Amount of TBZR equivalent to $ZrO_2$ (mol %) | 5 | 10 | 20 | 30 | 0 | 45 |
| Amount of fluoroalkyl siiane to $SiO_2$ (wt %) | 10 | 10 | 10 | 10 | 10 | 10 |
| Panel resistance (× $10^3$ ohms) | 4 | 5 | 6 | 7 | 5 | |
| Surface resistance (× $10^2$ ohms/□) | 2.7 | 3.3 | 4.0 | 4.6 | 3.0 | 5.0 |
| Film hardness | o | o | o | Δ | o | x |
| Hot water dipping test | o | o | o | o | o | o |
| Acid resisting test | o | o | o | o | o | o |
| Alkali resisting test | o | o | o | o | o | o |

Figure 4:
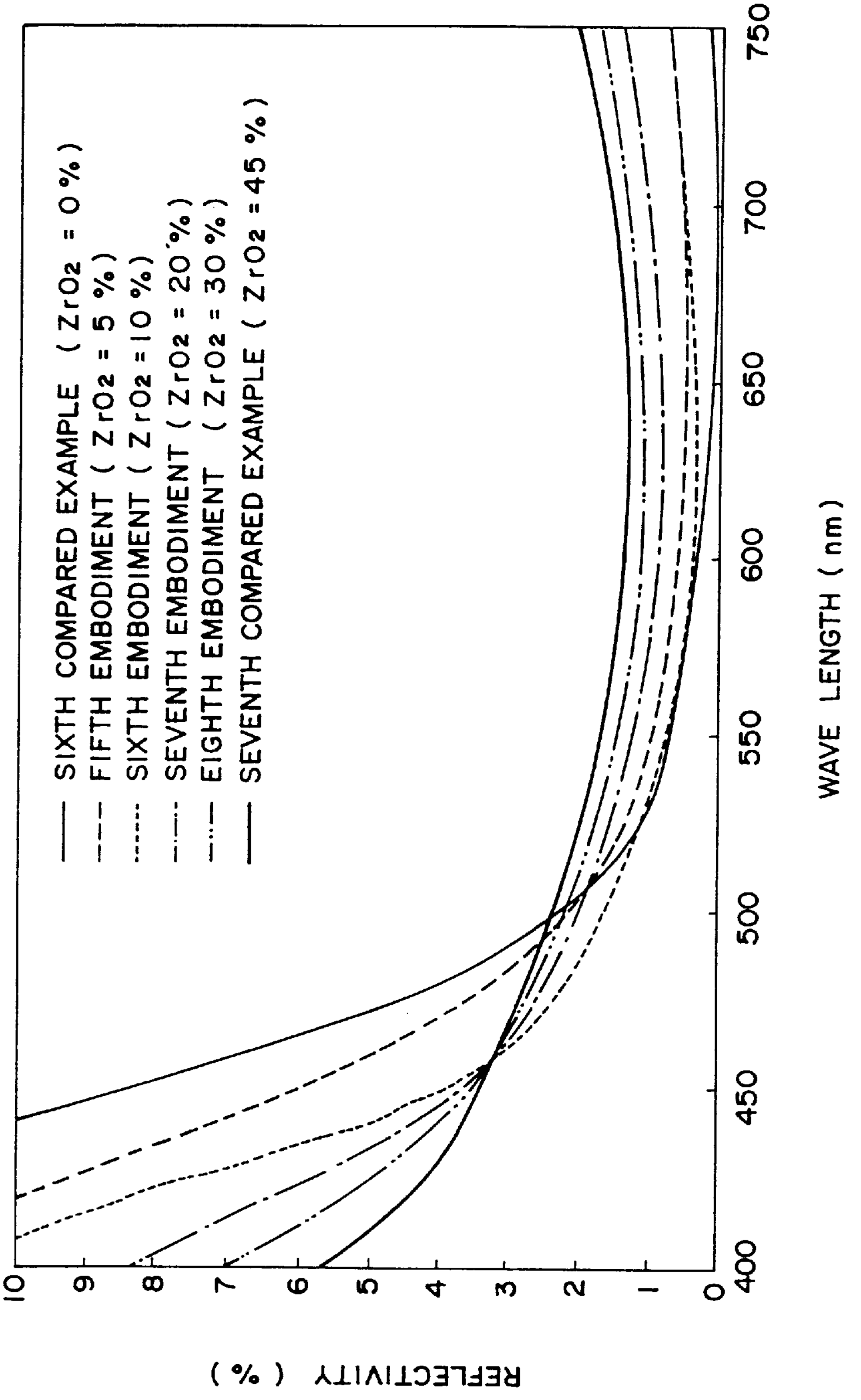
FIG. 4 is a graph showing measured results of spectroscopic regular reflection spectra of conductive anti-reflection films according to fifth to eighth embodiments and sixth and seventh compared examples.

FIG. 4 shows measured results of spectroscopic regular reflection spectra of the conductive anti-reflection films according to the fifth to eighth embodiments and the sixth and seventh compared examples.

As is clear from Table 3, the conductive anti-reflection films according to the fifth to eighth embodiments have low surface resistance that effectively prevents the AEF from taking place. In addition, these conductive anti-reflection films have sufficient film hardness. Moreover, these conductive anti-reflection films have excellent water resistance and chemical resistance that prevent these conductive anti-reflection films from being discolored, swelled, and/or peeled off when they are dipped in hot water, and acid water, and alkali water. In addition, as with the conductive anti-reflection films according to the fifth to eighth embodiments, the conductive anti-reflection film according to the sixth compared example has low surface resistance that effectively prevents the AEF from taking place. In addition, this conductive anti-reflection film has sufficient film hardness. Moreover, the conductive anti-reflection film has excellent water resistance and chemical resistance. In contrast, since the amount of TBZR added to the second coat film of the conductive anti-reflection film according to the seventh compared example exceeds 40 mol % to $SiO_2$ equivalent to $ZrO_2$. this conductive anti-reflection film is so low as it cannot be practically used.

In addition, as is clear from FIG. 4, the reflectivity of light with wave lengths of 400 to 450 nm (blue light) of the conductive anti-reflection films according to the fifth to eighth embodiment is low. The spectroscopic regular reflection of these conductive anti-reflection films is close to neutral. Particularly, in the conductive anti-reflection films according to the sixth to eighth embodiments of which the amount of TBZR added to the second coat film is 10 mol % or more to $SiO_2$ equivalent to $ZrO_2$, the reflectivity of light with a wave length of 400 nm is 10% or less, which is lower than that of the conductive anti-reflection film according to the sixth compared example of which the second coat film does not contain TBZR. Thus, the coloring characteristics of the conductive anti-reflection films according to the fifth to eighth embodiments are much improved in comparison with that of the conductive anti-reflection film according to the sixth compared example.

Ninth Embodiment

As first solutions containing a conductive substance, a silver compound solution with the same composition as the solution used in the first embodiment was prepared as solution A. As with the solution A, as a solution that does not contain a binder component, an ITO dispersed solution of which 2 g of ITO particles was dispersed in 100 g of ethanol was prepared as solution B. An ITO/silica dispersed solution that is a mixture of 2 g of ITO particles, 0.5 g of ethyl silicate (equivalent to $SiO_2$), and 100 g of ethanol was prepared as solution C. An ITO/silica dispersed solution that is a mixture of 2 g of ITO particles, 0.5 g of ethyl silicate (equivalent to $SiO_2$), and 100 g of ethanol was prepared as solution D. In addition, a second solution of which 10% by weight of alkoxy silane having a fluoroalkyl group expressed by $(MeO)_3SiC_2H_4C_6F_{12}C_2H_4Si(MeO)_3$ as solid content equivalent to $SiO_2$ was added to a silicate solution composed of 8 parts by weight of methyl silicate, 0.03 parts by weight of nitric acid (conq), 500 parts by weight of ethanol, and 15 parts by weight of water was prepared.

Next, a first solution corresponding to the solution A, B, C, or D was coated on the outer surface of a face panel (17-inch panel) that had been abraded and cleaned by the spin coat method in the same conditions as the first embodiment (namely, the spin coater was rotated at 80 rpm for 5 sec when the solution was poured; and the spin coater was rotated at 150 rpm for 80 sec when the solution was coated). Thus, corresponding to the solutions A, B, C, and D, a first coat film was formed. Thereafter, the second solution was coated on the first coat film that had not been dried or heated and dried in the conditions shown in Table 4 by the spin coat method in the conditions that the spin coater was rotated at 80 rpm for 5 sec when the solution was poured and that the spin coater was rotated at 150 rpm for 80 sec when the solution had been coated. Thus, a second coat film was formed. Corresponding to the solutions A, B, C, and D, the first and second coat films were sintered at a temperature of 210° C. for 30 minutes.

Next, the panel resistance of these conductive anti-reflection films was measured in the same manner as the first embodiment. Table 4 shows the measured results.

TABLE 4

| | Dry condition | | | |
|---|---|---|---|---|
| First solution | Ninth Embodiment Solution A | Eighth Compared Example Solution B | Ninth Compared Example Solution C | Tenth Compared Example Solution D |
| Not dried | 5 | 200 | 3000000 | 4000 |
| 80° C. × 30 min | 100 | 1000 | 3000000 | 5000 |
| 120° C. × 30 min | 30000 | 5000 | 3000000 | 5000 |
| 210° C. × 30 min | 200000 | 10000 | 3000000 | 5000 |

(Unit: × $10^3$ ohms)

As is clear from Table 4, in the case of the conductive anti-reflection film with the silver compound solution as the first solution, after the first coat film is formed, when the second coat film is formed on the first coat film that has not been dried, the conductive anti-reflection film has low panel resistance that effectively prevents the AEF from taking place. In contrast, when the first coat film is dried and then the second coat film is formed thereon, the panel resistance increases. Thus, sufficient conductivity that prevents the AEF from taking place cannot be obtained. As with the solution A, the conductive anti-reflection film formed with the ITO dispersed solution (solution B) that does not contain a binder component has similar characteristics as the conductive anti-reflection film formed with the solution A. However, when the first coat film is not dried and the second coat film is coated thereon, the panel resistance of the conductive anti-reflection film with the ITO disposed solution (solution B) is much higher than that of the conductive anti-reflection film with the solution A. The panel resistance of the conductive anti-reflection film with the solution C or D that contains a binder is very high regardless of whether or not the first coat film is dried.

Tenth Embodiment

10% by weight of alkoxy silane having a fluoroalkyl group expressed by $(MeO)_3SiC_2H_4C_6F_{12}C_2H_4Si(MeO)_3$ as solid content equivalent to $SiO_2$ was added to a silicate solution composed of 8 parts by weight of methyl silicate, 0.03 parts by weight of nitric acid (conq), 500 parts by weight of ethanol, and 15 parts by weight of water. In addition, 10 mol % of zirconium tetraisobutoxyde (TBZR) to $SiO_2$ equivalent to $ZrO_2$ was added to the resultant solution. Thus, a first solution was prepared. Next, 30% by weight of 3-glycidoxypropyltrimethoxysilane as solid content equivalent to $SiO_2$ was added to the silicate solution. Thus, a second solution was prepared.

Next, the first solution was coated on the first coat film formed on the outer surface of the face panel (17-inch panel) by the spin coat method in the same manner as the first embodiment. Thus, a second coat film was formed. Thereafter, the second solution was coated on the second coat film by the spin coat method in the conditions that the spin coater was rotated at 80 rpm for 5 sec when the solution was poured, and that the spin coater was rotated at 150 rpm for 80 sec when the solution had been coated. Thus, a third coat film was formed. Thereafter, the first to third coat films were sintered at a temperature of 210° C. for 30 minutes.

Next, the panel resistance, surface resistance, and film hardness of the conductive anti-reflection film according to the tenth embodiment were measured in the same manner as the first embodiment. In addition, the hot water dipping test and the chemical resistance test of this conductive anti-reflection film were performed in the same manner as the third and fourth embodiments. Moreover, the spectroscopic regular reflection spectrum of the conductive anti-reflection film was measured in the same manner as the fifth to eight embodiments.

Thus, the conductive anti-reflection film according to the tenth embodiment has low surface resistance that effectively prevents the AEF from taking place. In addition, the conductive anti-reflection film has sufficient hardness. Moreover, the conductive anti-reflection film has water resistance and chemical resistance that prevents it from being discolored, swelled, and/or peeled off when it is dipped in hot water, acid solution, and alkali solution.

The reflectivity of light with wave lengths of 400 nm to 500 nm (blue color) of the conductive anti-reflection film according to the tenth embodiment is very low. The spectroscopic regular reflection of the conductive anti-reflection film according to the tenth embodiment is closer to neutral than that of the conductive anti-reflection films according to the fifth to eighth embodiments. Thus, the reflected light can be sufficiently prevented from being colored.

Thus, since the surface resistance of the conductive anti-reflection film according to the present invention is very low, in a cathode ray tube such as a TV Braun tube or a display of a computer, the AEF (Alternating Electric Field) can be almost prevented.

In addition, since the conductive anti-reflection film according to the present invention does not allow chemicals and so forth to penetrate therein, it has excellent water resistance and chemical resistance. Thus, the conductive anti-reflection film can be stably used for a long time.

Moreover, the conductive anti-reflection film according to the present invention is structured so that the difference of refractive indexes of individual layers becomes small. Thus, the reflectivity of light of the conductive anti-reflection film is low and the spectroscopic regular reflection thereof almost becomes neutral.

According to the fabrication method of the conductive anti-reflection film of the present invention, the expansion coefficients of adjacent films are almost the same when they are sintered. Thus, a conductive anti-reflection film with low surface resistance can be fabricated.

According to the fabrication method of the conductive anti-reflection film according to the present invention, a conductive anti-reflection film that does not cause chemicals and so forth to penetrate therein is obtained. Thus, a conductive anti-reflection film that has excellent water resistance and chemical resistance and that is stably used for a long time can be fabricated.

According to the fabrication method of the conductive anti-reflection film of the present invention, the difference of refractive indexes of individual layers becomes small. Thus, a conductive anti-reflection film with low reflectivity and almost neutral spectroscopic regular reflection characteristics can be fabricated.

In addition, according to the fabrication method of the conductive anti-reflection film of the present invention, a conductive anti-reflection film with the above-described characteristics can be fabricated by simple and effective method called coat method (wet method). Thus, a conductive anti-reflection film can be quantitatively provided at low cost.

Thus, when the fabrication method of the conductive anti-reflection film of the present invention is applied for a fabrication process of a cathode ray tube, a cathode ray tube that is free from the AEF (Alternating Electric Field) and that displays a high quality picture for a long time can be easily provided.

In addition, the cathode ray tube according to the present invention has a conductive anti-reflection film with sufficiently low surface resistance. Thus, the AEF (Alternating Electric Field) can be almost prevented.

Moreover, since the cathode ray tube according to the present invention has a conductive anti-reflection film with excellent water resistance and chemical resistance, it can stably display a picture for a long time.

Furthermore, since the cathode ray tube according to the present invention has a conductive anti-reflection film with low reflectivity and almost neutral spectroscopic regular reflection characteristics, it can display a high quality picture.

Thus, a cathode ray tube that is almost free from the AEF (Alternating Electric Field), that has a reliability for a long time, and that displays a high quality picture can be provided.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

What is claimed is:

1. A fabrication method of a conductive anti-reflection film, comprising the step of:

forming a first coat film on a substrate, the first coat film containing a conductive substance and having a first expansion coefficient under a first condition;

forming a second coat film on the first coat film, the second coat film having a second expansion coefficient substantially equal to the first coefficient under the first condition; and sintering the first and second coat films.

2. The fabrication method as set forth in claim 1, wherein the first condition is:

(1) pressure ranging from 0.1 to 4.0 atm; and (2) temperature ranging 300 to 700 K.

3. The fabrication method as set forth in claim 1, wherein the conductive substance is at least one selected from the group consisting of silver, silver alloy, silver compound, copper, copper alloy, copper compound, and a mixture thereof.

4. The fabrication method as set forth in claim 1, wherein the substrate is a face plate of a cathode ray tube.

5. The fabrication method as set forth in claim 1, wherein the second coat film comprises a compound having a fluoroalkyl group.

* * * * *